US009847359B2

(12) United States Patent
Belsher et al.

(10) Patent No.: US 9,847,359 B2
(45) Date of Patent: Dec. 19, 2017

(54) IMAGE SENSORS WITH IMPROVED SURFACE PLANARITY

(71) Applicant: SEMICONDUCTOR COMPONENTS INDUSTRIES, LLC, Phoenix, AZ (US)

(72) Inventors: Aaron Belsher, Boise, ID (US); Richard Mauritzson, Meridian, ID (US); Swarnal Borthakur, Boise, ID (US); Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 10 days.

(21) Appl. No.: 15/139,505

(22) Filed: Apr. 27, 2016

(65) Prior Publication Data

US 2017/0141146 A1    May 18, 2017

Related U.S. Application Data

(60) Provisional application No. 62/256,328, filed on Nov. 17, 2015.

(51) Int. Cl.
*H01L 27/146* (2006.01)

(52) U.S. Cl.
CPC .... *H01L 27/14603* (2013.01); *H01L 27/1464* (2013.01); *H01L 27/14632* (2013.01); *H01L 27/14636* (2013.01); *H01L 27/14643* (2013.01); *H01L 27/14689* (2013.01)

(58) Field of Classification Search
CPC ................. H01L 27/1464; H01L 21/76898
See application file for complete search history.

(56) References Cited

U.S. PATENT DOCUMENTS

| 4,622,574 | A | 11/1986 | Garcia |
|---|---|---|---|
| 6,344,369 | B1 | 2/2002 | Huang |
| 7,803,653 | B2 | 9/2010 | Yoo |
| 8,202,797 | B2 | 6/2012 | Chi |
| 8,680,635 | B2 | 3/2014 | Tseng |
| 8,710,612 | B2 | 4/2014 | Tsai |
| 8,796,805 | B2 | 8/2014 | Ting |
| 2006/0073687 | A1 | 4/2006 | Vullers |

(Continued)

*Primary Examiner* — Caleb Henry
*Assistant Examiner* — Mounir Amer
(74) *Attorney, Agent, or Firm* — Treyz Law Group, P.C.; Joseph F. Guihan

(57) ABSTRACT

A backside illuminated image sensor with an array of pixels formed in a substrate is provided. To improve surface planarity, bond pads formed at the periphery of the array of pixels may be recessed into a back surface of the substrate. The bond pads may be recessed into a semiconductor layer of the substrate, may be recessed into a window in the semiconductor layer, or may be recessed in a passivation layer and covered with non-conductive material such as resin. In order to further improve surface planarity, a window may be formed in the semiconductor layer at the periphery of the array of pixels, or scribe region, over alignment structures. By providing an image sensor with improved surface planarity, device yield and time-to-market may be improved, and window framing defects and microlens/color filter non-uniformity may be reduced.

20 Claims, 10 Drawing Sheets

(56) References Cited

U.S. PATENT DOCUMENTS

| | | | |
|---|---|---|---|
| 2007/0215971 A1* | 9/2007 | Yamamoto | H01L 27/14601 257/432 |
| 2008/0037197 A1* | 2/2008 | Casset | H01G 5/0132 361/287 |
| 2008/0116537 A1 | 5/2008 | Adkisson | |
| 2010/0155796 A1* | 6/2010 | Koike | H01L 21/76898 257/292 |
| 2011/0224867 A1* | 9/2011 | Yoshikawa | F02D 41/2425 701/33.4 |
| 2012/0086092 A1* | 4/2012 | Yanagita | H01L 27/14636 257/432 |
| 2013/0009270 A1 | 1/2013 | Tsai | |
| 2013/0037958 A1 | 2/2013 | Ho | |
| 2013/0249033 A1 | 9/2013 | Kim | |
| 2015/0249102 A1* | 9/2015 | Terada | H01L 27/1464 257/444 |
| 2016/0260756 A1* | 9/2016 | Yamagishi | H04N 5/374 |

* cited by examiner

IMAGE SENSORS WITH IMPROVED SURFACE PLANARITY

CROSS-REFERENCE TO RELATED APPLICATIONS

This application claims priority to U.S. Provisional Application No. 62/256,328, filed on Nov. 17, 2015, entitled "Image Sensors with Improved Surface Planarity," invented by Aaron Belsher, Richard Mauritzson, Swarnal Borthakur and Ulrich Boettiger, and is incorporated herein by reference and priority thereto for common subject matter is hereby claimed.

BACKGROUND

This relates generally to image sensors, and more specifically, backside illuminated image sensors with improved surface planarity.

Modern electronic devices such as cellular telephones, cameras, and computers often use digital image sensors. Imagers (i.e., image sensors) include a two-dimensional array of image sensing pixels. Each pixel includes a photosensor such as a photodiode that receives incident photons (light) and converts the photons into electrical charges. Conventional image pixel arrays include frontside illuminated image pixels or backside illuminated image pixels. Image pixels are fabricated on a semiconductor substrate using complementary metal-oxide-semiconductor (CMOS) technology or charge-coupled device (CCD) technology.

In conventional backside illuminated image pixels, bond pads are often formed above the surface of the substrate at the periphery of the pixel region, which increases surface topography. High surface topography can negatively impact device yield by causing window framing (i.e., nonlinearity at edges of the image sensor), streak defects and shading defects during subsequent processing of the color filter array (CFA) and microlenses. For example, in conventional fabrication of color filter array elements and microlenses on a wafer, resist spin coating operations can sometimes result in regions of the wafer having an overly thin or overly thick covering of photoresist (commonly referred to as streaking). This streaking results from high levels of deviation in the depth of surface features such as bond pads, trenches, and recessed arrays. The deviation in surface topography prevents resist from spreading uniformly across the surface of the wafer (e.g., features that protrude above or that create a depression in the wafer surface block the flow of resist). Such streaking results in an undesirable reduction in device quality and, consequently, reduced device yield.

Some conventional backside illuminated image sensors have bond pads that are partially recessed in a substrate, where a top surface of each bond pad extends above a top surface of the substrate. Such bond pads are connected to through-silicon via structures through a metal layer on the top surface of the substrate, where the through-silicon via structures are adjacent to the bond pads. These image sensor bond pads contribute to undesirable surface topography as described above because they extend above the surface of the substrate. Other conventional image sensors have bond pads that are recessed into a substrate such that a top surface of each bond pad is below a top surface of the substrate. These image sensor bond pads also contribute to undesirable surface topography as described above because the top surface of each bond pad does not extend to the top surface of the substrate and thereby creates a depression in the surface of the image sensor.

Alignment structures for use in photolithographic processing are sometimes formed in the scribe-line area between adjacent dies. In conventional backside illuminated image sensors, it is necessary to create openings in the scribe line substrate so that the alignment structures are visible from the backside. This process further contributes to high topography.

It would therefore be desirable to provide image sensors with improved surface planarity in areas in which bond pads and alignment structures are formed.

DETAILED DESCRIPTION

Figure 1:
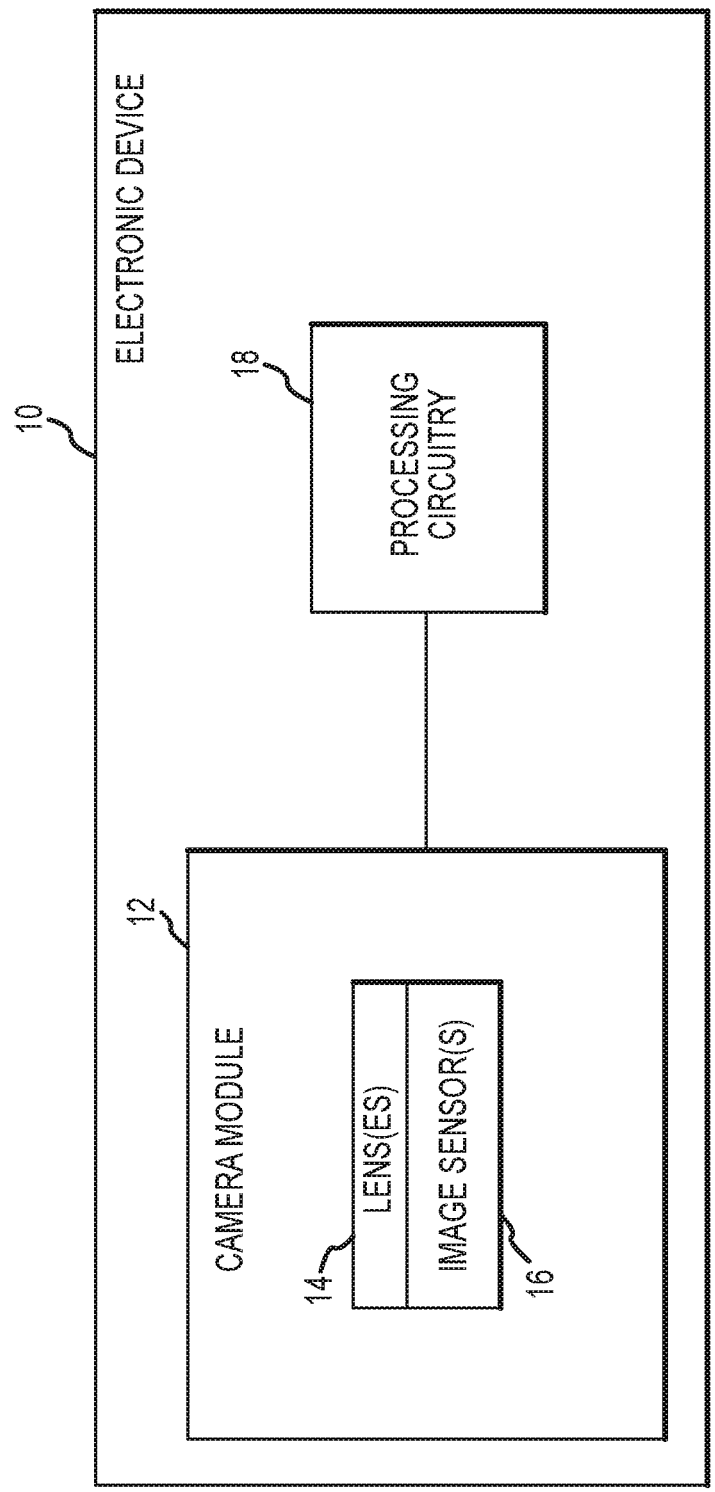
FIG. 1 is a diagram of an illustrative electronic device in accordance with an embodiment.

FIG. 1 is a diagram of an illustrative electronic device that uses an image sensor to capture images. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include a lens 14 and a corresponding image sensor 16. Lens 14 and image sensor 16 may be mounted in a common package and may provide image data to storage and processing circuitry 18. In some embodiments lens 14 may be part of an array of lenses and image sensor 16 may be part of an image sensor array.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor 16 or an integrated circuit within module 12 that is associated with image sensor 16). Image data that has been captured and processed by camera module 12 may, if desired, be further processed and stored using storage and processing circuitry 18. Processed image data may, if desired, be provided to external equipment (e.g., a computer or other device) using wired and/or wireless communications paths coupled to storage and processing circuitry 18.

Figure 2:
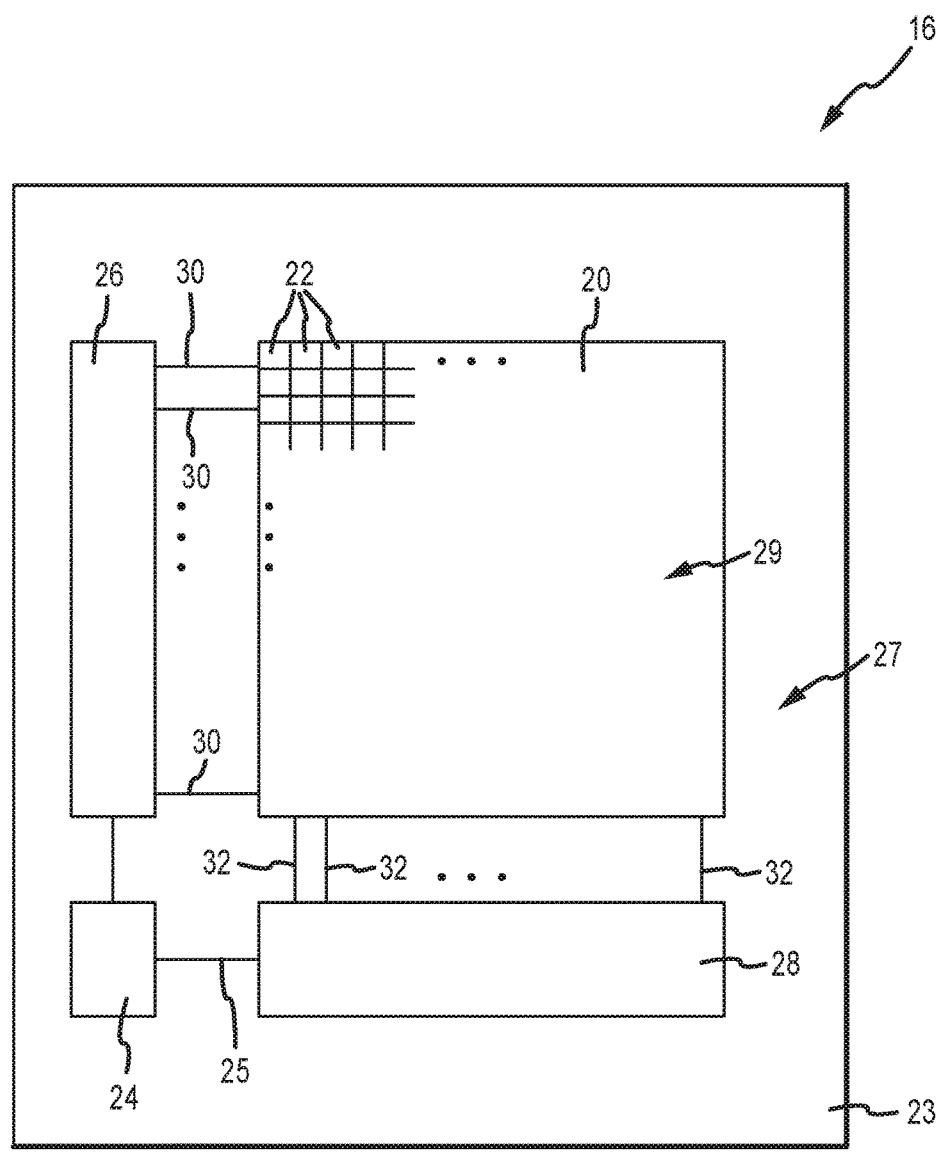
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Pixel array 20, control and processing circuitry 24, row control circuitry 26, and image readout circuitry 28 may be formed on a substrate 23. If desired, some or all of the components of image sensor 16 may instead be formed on substrates other than substrate 23, which may be connected to substrate 23, for instance, through stacked wafer interconnects, through-silicon-vias (TSV's), wire bonding, or flip-chip bonding.

Substrate 23 may include a photosensitive region 29 in which pixel array 20 is located and a peripheral region 27 in which non-photosensitive structures are located. Peripheral region 27 may extend from array 20 to the edge of substrate 23. Peripheral region 27 may include row control circuitry 26, image readout circuitry 28, and control and processing circuitry 24, among other structures. Peripheral region 27 may also include the scribe-line area through which the substrate is cut or singulated using a dicing blade. Alignment structures for photolithographic alignment may be formed in the scribe-line area of the peripheral region 27 and bond pad structures for bonding to external circuitry may be formed in peripheral region 27 as well. If desired, alignment structures and bond pads may be formed in the peripheral region of substrate 23 on respectively opposite sides of array 20 or, if desired, on the same side of array 20.

Row control circuitry 26 may receive row addresses from control circuitry 24 and supply corresponding row control signals such as reset, row-select, charge transfer, dual conversion gain, and readout control signals to pixels 22 over row control paths 30. Control paths 30 may, for example, be coupled to bond pads in peripheral region 27. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, a color filter array may be formed over photosensitive regions in array 20 so that a desired color filter element in the color filter array is formed over an upper surface of the photosensitive region of an associated pixel 22. The color filters used for the color filter array may, for example, be red filters, blue filters, and green filters. Other filters such as clear color filters, yellow color filters, dual-band IR cutoff filters (e.g., filters that allow visible light and a range of infrared light emitted by LED lights), etc. may also be used. A microlens may be formed over an upper surface of the color filter array to focus incoming light onto the photosensitive region associated with that pixel 22. Incoming light may be focused onto the photosensitive region by the microlens and may pass through the color filter element so that only light of a corresponding color is captured at the photosensitive region.

Figure 3:
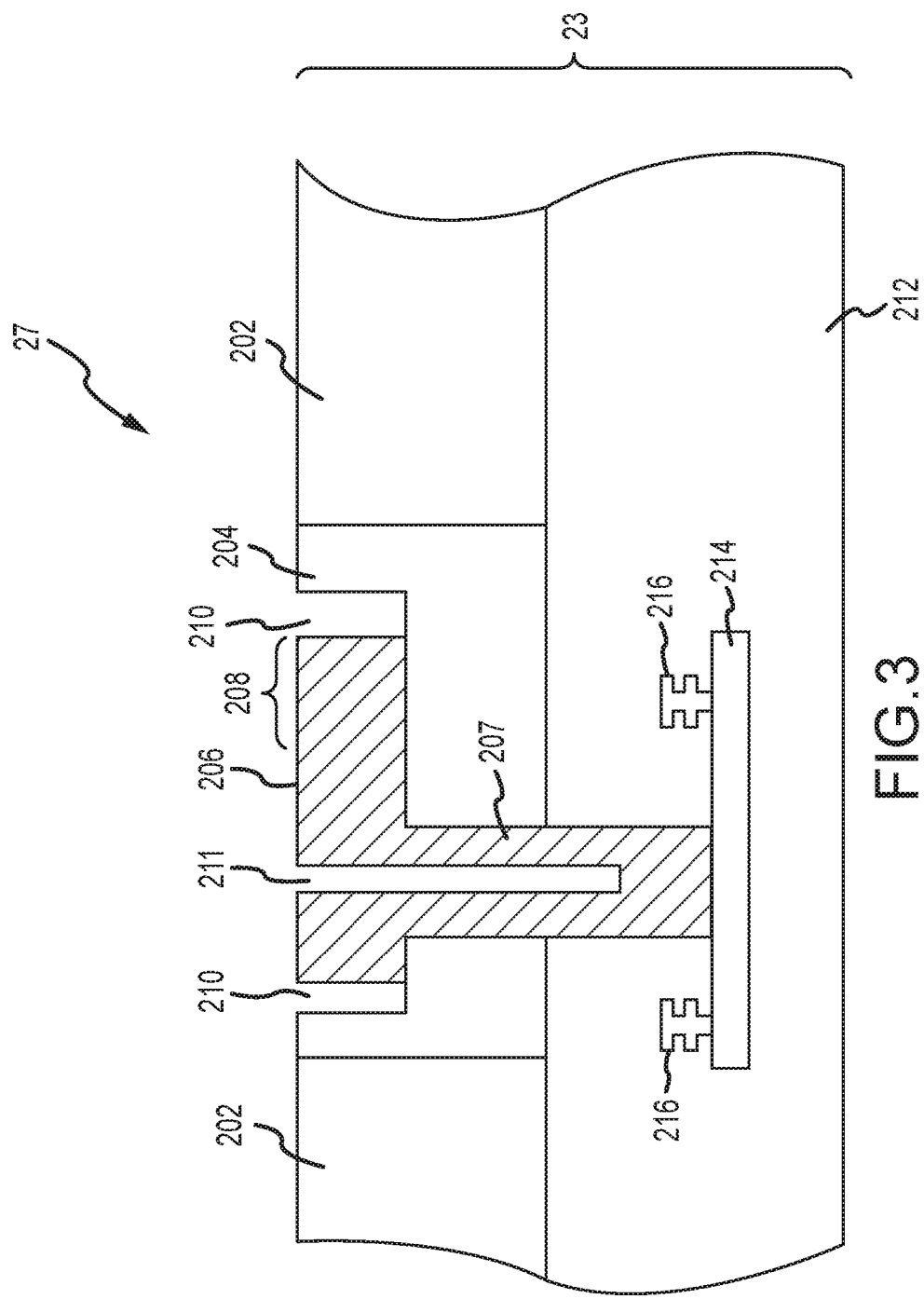
FIG. 3 is a cross-sectional side view of an intermediate processing stage of an illustrative image sensor having a bond pad recessed in a window in accordance with an embodiment.

An illustrative example of a bond pad that may be formed in peripheral region 27 of a substrate 23 of the type shown and described in connection with FIG. 2 is shown in FIG. 3. The example of FIG. 3 shows a cross-sectional side view of an intermediate processing stage of an illustrative image sensor in which a bond pad is recessed in a window in a semiconductor substrate. As shown in FIG. 3, a bond pad 206 may be recessed in a window 204 formed in a semiconductor substrate 202. In order to ensure surface planarity and low surface topography, bond pad 206 may have a top surface that is substantially planar to (i.e., coplanar with) a top surface of window 204. For example, the top surface of bond pad 206 may extend to, but may not extend above, the top surface of window 204, such that the top surface of bond pad 206 is aligned with the top surface of window 204. Semiconductor substrate 202 may be formed of any desirable semiconductor material (e.g., epitaxial silicon, silicon carbide, gallium nitride, gallium arsenide, etc.). Window 204 may be an oxide, or any dielectric film, such as silicon dioxide. Bond pad 206 may be formed of metal such as aluminum, or any other desirable conductive material. Bond pad 206 may contact a conductive pad 214 through a conductive via 207 in a through-hole of window 204 and passivation layer 212. Passivation layer 212 may be an inter-metallic dielectric layer. Conductive via 207 may be made of metal, such as aluminum. Conductive pad 214 may be a metal pad and may be electrically coupled to interconnects 216, which may carry signals between analog circuitry, digital circuitry, logic blocks, the pixel array, etc. (e.g., pixels 22 shown in FIG. 2) and conductive pad 214. Gaps 210 and 211 may remain after etching of window 204 and deposition (e.g., e-beam evaporation, sputtering, etc.) of the metal used to form bond pad 206 and via 207. Gaps 210 and 211 may optionally be filled with dielectric material, such as photoresist, during a later processing step in order to further improve surface planarity. Bond pad 206 may be electrically connected to external circuitry through a connection (e.g., wire bond, solder ball, etc.) bonded, for example, to surface 208 of bond pad 206.

The oxide window 204 provides additional isolation between bond pad 206 and surrounding semiconductor layer 202, reducing undesirable capacitive coupling, and it is less likely that oxide punch-through could cause bond pad 206 to undesirably short to semiconductor layer 202. Bond pad 206 being recessed in window 204 provides a lower topography for the pixel array, which increases surface planarity. For example, the top surface of bond pad 206 may be within 0.5 um of the top surface of semiconductor layer 202. This improved surface planarity improves device yield, reduces the time required for process tuning of new products, and reduces window framing, streaking defects, and shading defects.

Figure 4:
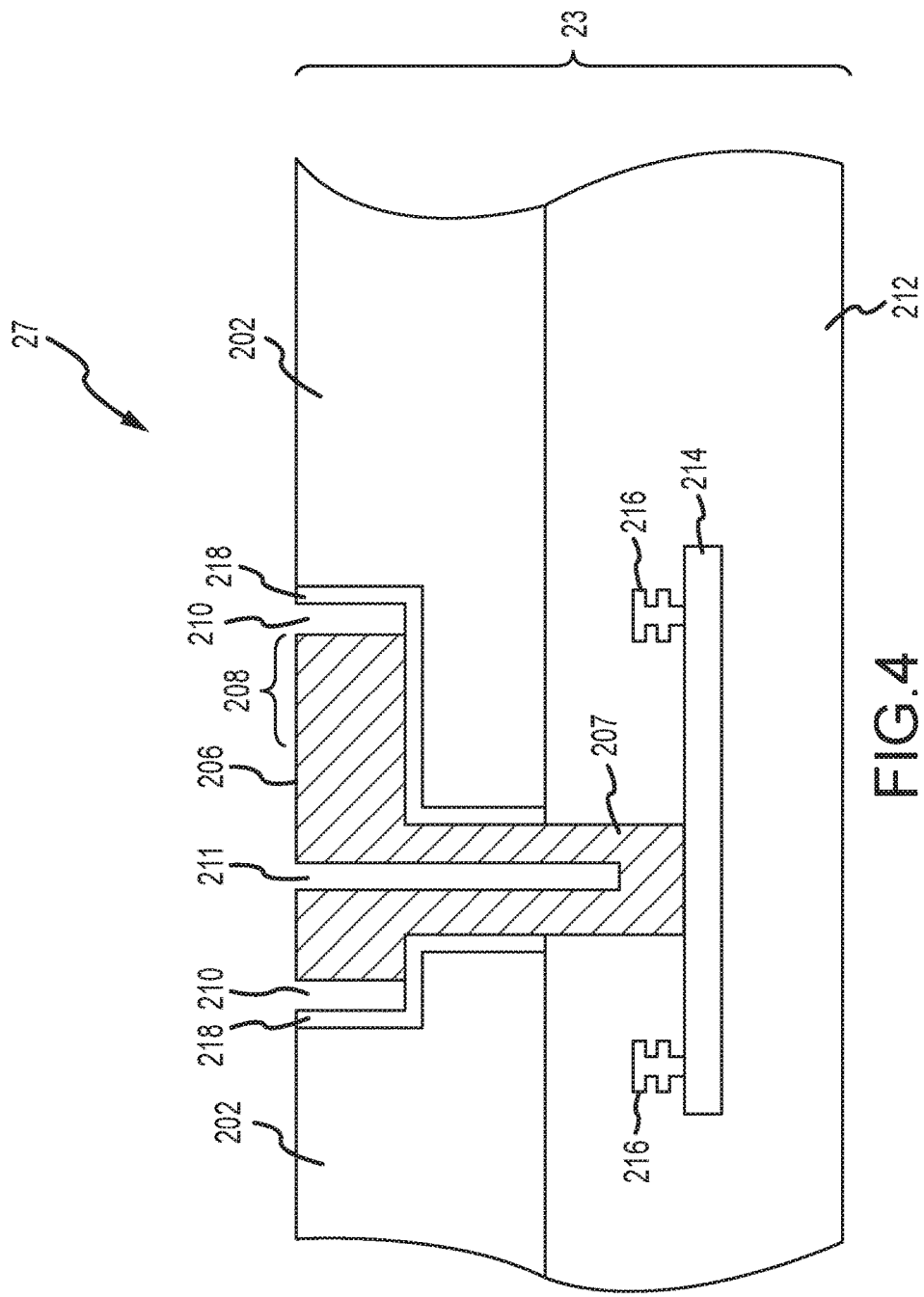
FIG. 4 is a cross-sectional side view of an intermediate processing stage of an illustrative image sensor having a bond pad recessed in a semiconductor layer in accordance with an embodiment.

An illustrative example of a bond pad that may be formed in the peripheral region 27 of a substrate 23 of the type shown and described in connection with FIG. 2 is shown in FIG. 4. The example of FIG. 4 shows a cross-sectional side view of an intermediate processing stage of an illustrative image sensor in which a bond pad is recessed in a semiconductor layer.

As shown in FIG. 4, bond pad 206 may be recessed in semiconductor substrate 202 and may contact conductive pad 214 through conductive via 207. In order to ensure surface planarity and low surface topography, bond pad 206 may have a top surface that is substantially planar to (i.e., coplanar with) a top surface of semiconductor substrate 202. For example, the top surface of bond pad 206 may extend to, but may not extend above, the top surface of semiconductor substrate 202, such that the top surface of bond pad 206 is aligned with the top surface of semiconductor substrate 202. Oxide 218 may be formed between bond pad 206 and semiconductor substrate 202 in order to prevent bond pad 206 from shorting to semiconductor substrate 202.

Bond pad 206 being recessed in semiconductor substrate 202 such that the top surface of bond pad 206 is substantially planar to the top surface of semiconductor substrate 202 provides a lower topography for the pixel array by increasing surface planarity. For example, the top surface of bond pad 206 may be within 0.5 um of the top surface of semiconductor layer 202. This improved surface planarity improves device yield, reduces the time required for process tuning of new products, and reduces window framing, streaking defects, and shading defects.

Figure 5:
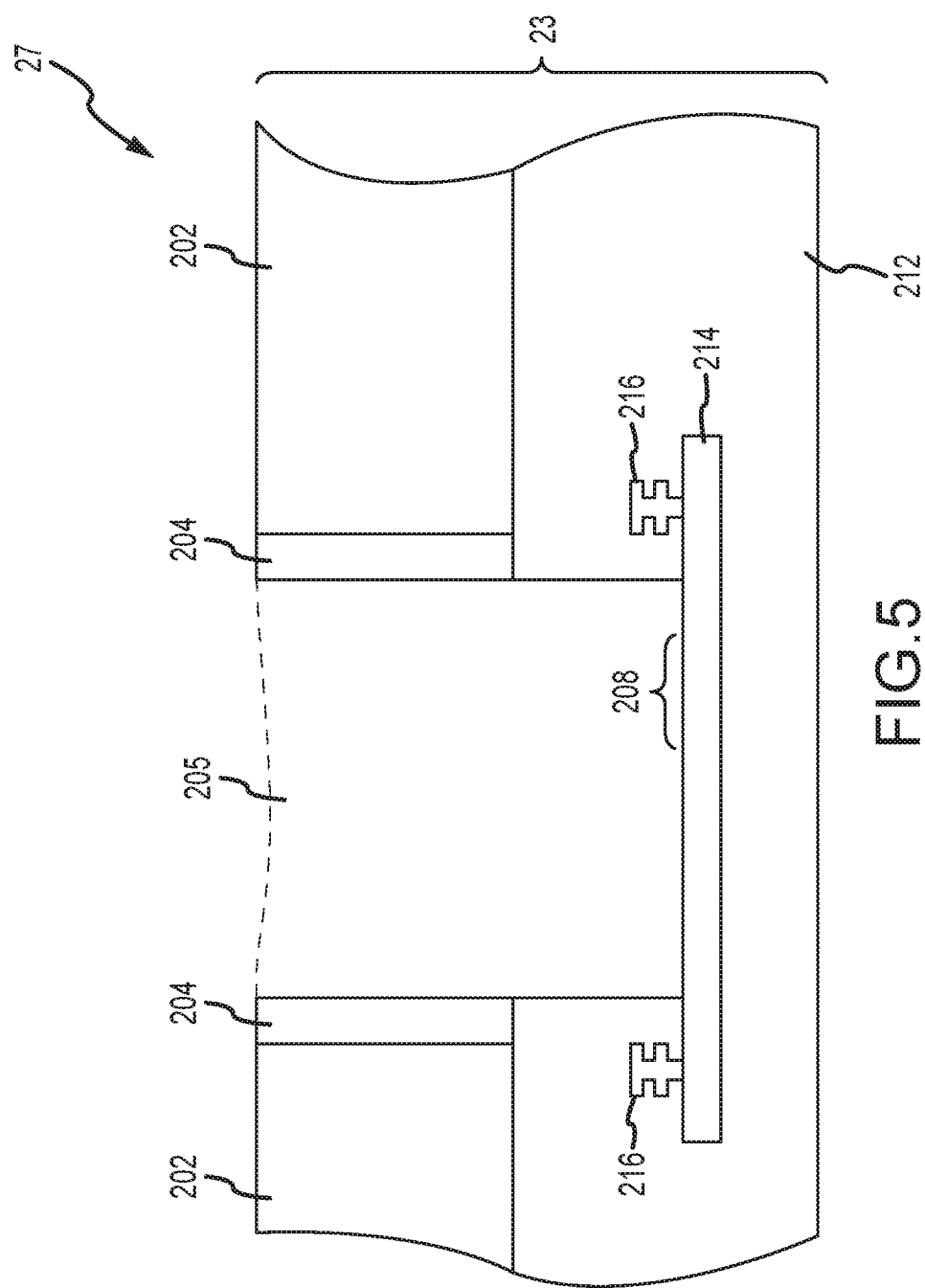
FIG. 5 is a cross-sectional side view of an intermediate processing stage of an illustrative image sensor having a bond pad recessed in a passivation layer in accordance with an embodiment.

An illustrative example of a bond pad that may be formed in the peripheral region 27 of a substrate 23 of the type shown and described in connection with FIG. 2 is shown in FIG. 5. The example of FIG. 5 shows a cross-sectional side view of an intermediate processing stage of an illustrative image sensor in which a bond pad is recessed in a passivation layer. As shown in FIG. 5, conductive pad 214 may be formed in passivation layer 212 and may be connected to image sensor circuitry (e.g., pixels 22 shown in FIG. 2) through interconnects 216. Window 204 may be formed in semiconductor layer 202 above conductive pad 214.

A hole may be formed (e.g., by etching window 204 and passivation layer 212) in a region 205 above conductive pad 214. Conductive pad 214 may be electrically connected to external circuitry through a connection (e.g., wire bond, solder ball, etc.) bonded, for example, to surface 208 of conductive pad 214. This hole may be opened after all surface processing (including color filter array and microlens formation) is complete to ensure that the surface is planar during the surface processing. If the hole is opened before, then it must be filled with a non-conductive material, such as photoresist or any other desirable resin to ensure the surface is planar. The photoresist or any other desirable resin or dielectric material must be removed after the surface processing is complete and before the conductive pad 214 is bonded to the external circuitry.

Figure 6:
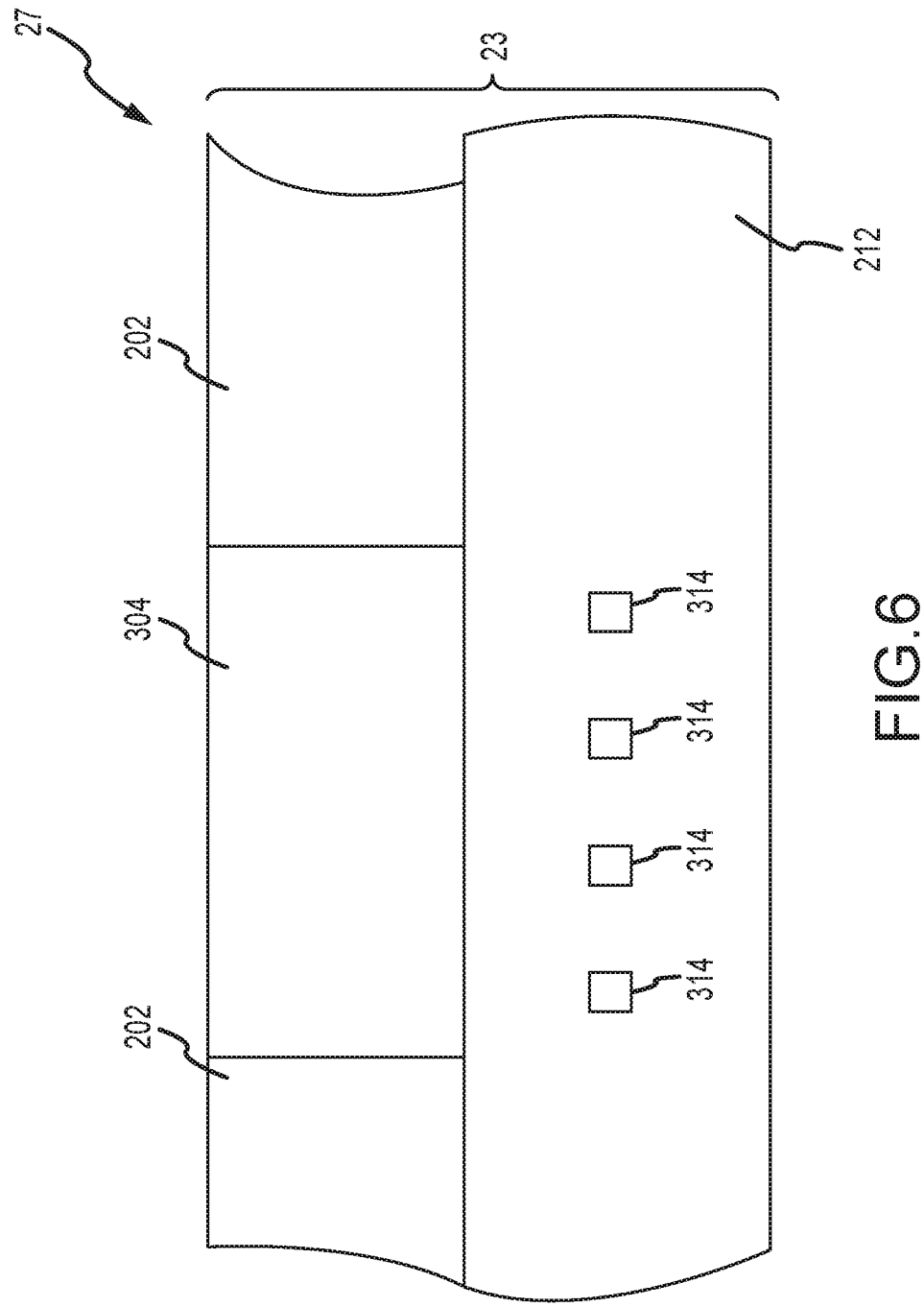
FIG. 6 is a cross-sectional side view of an intermediate processing stage of an illustrative image sensor having alignment structures formed under a window in accordance with an embodiment.

An illustrative example of alignment structures that may be formed in the peripheral region 27 or scribe-line region between adjacent dies of a substrate 23 of the type shown and described in connection with FIG. 2 is shown in FIG. 6. The example of FIG. 6 shows a cross-sectional side view of an intermediate processing stage of an illustrative image sensor in which alignment structures are formed in a passivation layer and a window is formed in a semiconductor substrate over the alignment structures. As shown in FIG. 6, alignment marks 314 may be formed in passivation layer 212. Alignment marks 314 may be formed from any desirable material (e.g., metal, polysilicon, etc.) such that alignment marks 314 may be observed during mask alignment steps of a photolithographic process. A window 304 may be formed in semiconductor layer 202 over alignment marks 314 in during either front-end-of-line processing or during a backside thinning process as desired. Window 304 may be an oxide or any transparent film, such as silicon dioxide. Window 304 may be formed in order to aid in viewing alignment marks 314 during mask alignment processing steps (e.g., for microlens formation or any other desired backside processing step).

In embodiments in which window 304 is formed during front-end-of-line processing, semiconductor substrate 202 may be patterned and etched to form a cavity in an alignment mark region of semiconductor substrate 202. The cavity may then be filled with an oxide or transparent film, such as silicon dioxide, and may be further processed through chemical mechanical polishing (CMP) to ensure planarity. Alignment marks 314 may then be formed in passivation layer 212 or, if desired, in window 304.

In embodiments in which window 304 is formed during a backside thinning process, alignment marks 314 may already be present in passivation layer 212 before backside processing occurs. The backside of semiconductor substrate 202 may undergo coarse grind, fine grind, and wet silicon etch processes. Then the backside of semiconductor substrate 202 may be patterned and etched at any point during the thinning process to form a cavity in an alignment mark region of semiconductor substrate 202. The alignment needed to pattern this cavity may be accomplished by coarse alignment (e.g. infra-red alignment or global alignment). The cavity may then be filled with an oxide or transparent film, such as silicon dioxide. The alignment mark region of backside of semiconductor substrate 202 may then be processed through chemical mechanical polishing before a final chemical mechanical polish is performed of the entire backside surface of semiconductor substrate 202.

The embodiment shown in FIG. 6 is advantageous over conventional backside illuminated image sensor alignment mark formation processes. In conventional processes, the backside of a silicon substrate in a region over alignment marks must be etched in order to make the alignment marks visible during mask alignment, which leaves an undesirable topography in the silicon. In the illustrative embodiment of FIG. 6, however, window 304 allows alignment marks to be seen during mask alignment while maintaining the planarity of the surface around the alignment region (i.e., there is no undesirable topography). Additionally, this improved planarity may improve uniformity of color filters and microlenses formed over pixels (e.g., pixels 22 shown in FIG. 2) in the image sensor (e.g., image sensor 16 shown in FIG. 1).

In some embodiments, instead of forming window 304, the portion of semiconductor substrate 202 in the alignment region may be etched such that alignment marks 314 are visible during mask alignment processes. The cavity left by the thinning of semiconductor substrate 202 may then be filled with material, such as photoresist or any other desirable resin, in order to obtain a more planar surface. A draw-back of this approach is that resins, photoresists, or other spin-on materials typically do not planarize large regions as effectively as a chemical-mechanical polished oxide film.

Figure 7:
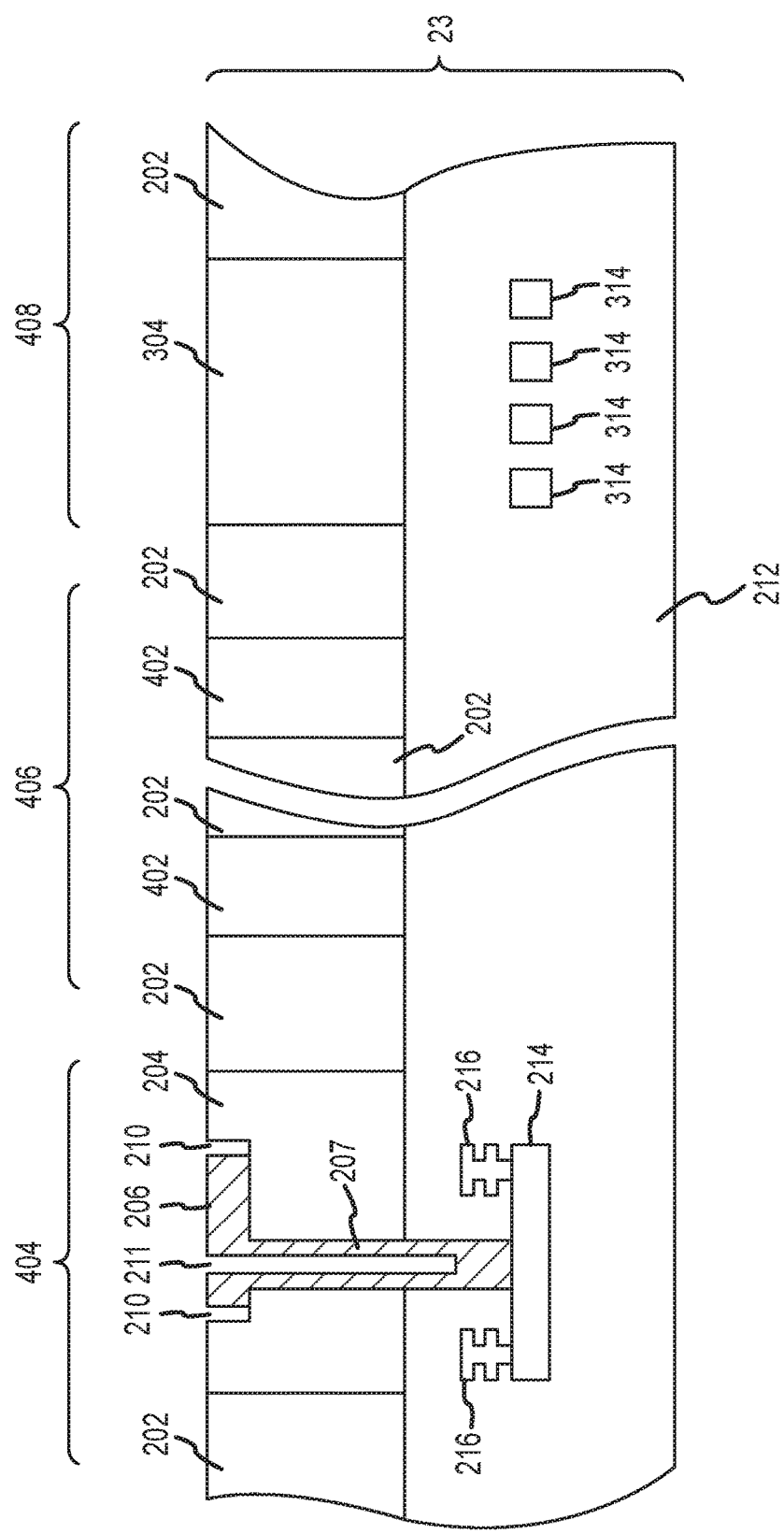
FIG. 7 is a cross-sectional side view of an intermediate processing stage of an illustrative image sensor having a bond pad recessed in a window and alignment structures formed under another window in accordance with an embodiment.

The example of FIG. 7 shows a cross-sectional side view of an intermediate processing stage of an illustrative image sensor in which a bond pad is recessed in a window and another window is formed over alignment marks. As shown in FIG. 7, photosensitive region 406 may contain photodiodes 402 formed in semiconductor substrate 202, bond pad region 404 may be located at the periphery of photosensitive region 406 and may contain bond pad 206 recessed in window 204 (e.g., the embodiment described above in connection with FIG. 3), and alignment region 408 may be located at the periphery of photosensitive region 406 or between adjacent dies, and may contain window 304 formed over alignment marks 314 (e.g., the embodiment described above in connection with FIG. 6).

Figure 8:
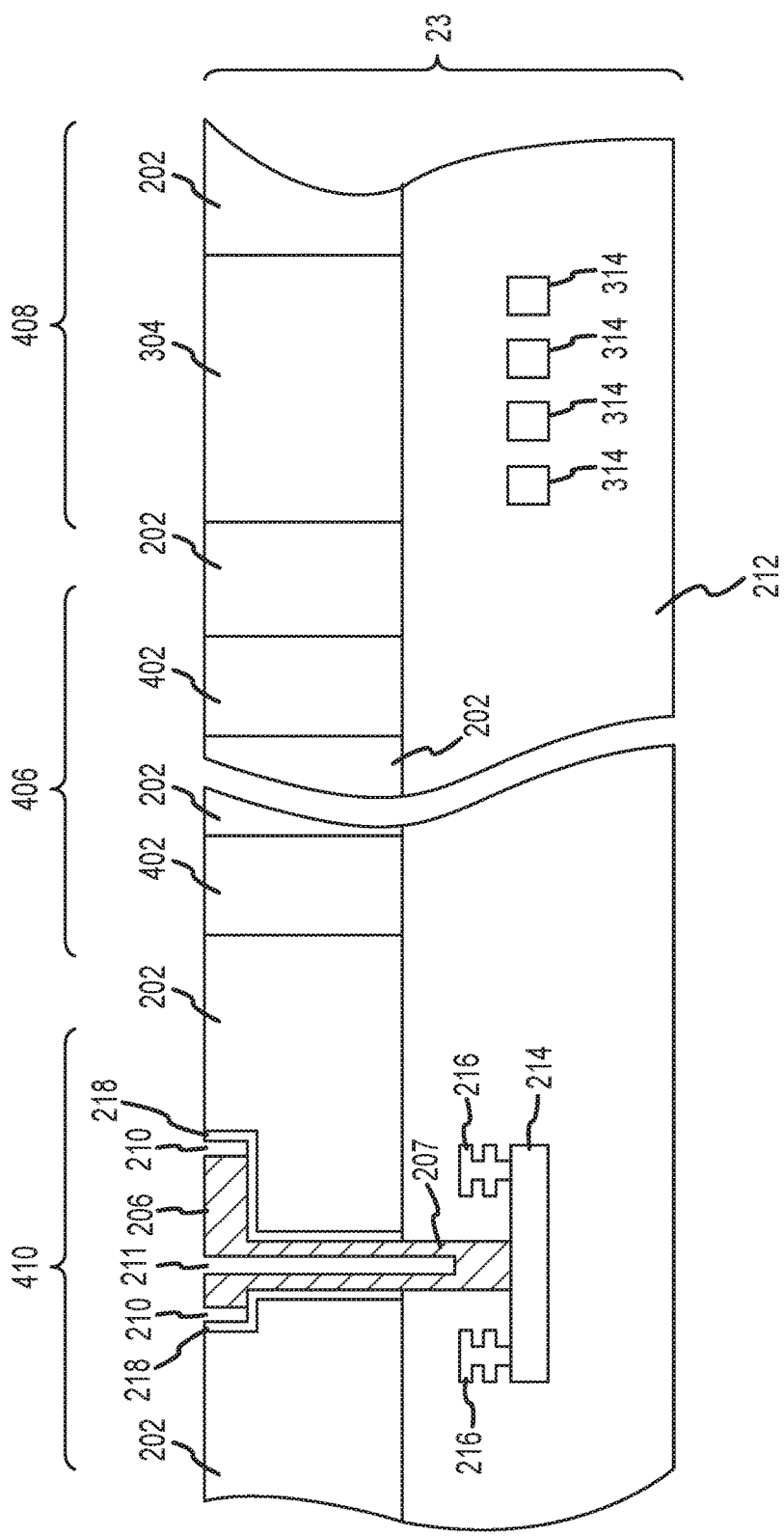
FIG. 8 is a cross-sectional side view of an intermediate processing stage of an illustrative image sensor having a bond pad recessed in a semiconductor layer and alignment structures formed under a window in accordance with an embodiment.

The example of FIG. 8 shows a cross-sectional side view of an intermediate processing stage of an illustrative image sensor in which a bond pad is recessed in a semiconductor substrate and a window is formed over alignment marks. As shown in FIG. 8, photosensitive region 406 may contain photodiodes 402 formed in semiconductor substrate 202, bond pad region 410 may be located at the periphery of photosensitive region 406 and may contain bond pad 206 recessed in semiconductor substrate 202 (e.g., the embodiment described above in connection with FIG. 4), and alignment region 408 may be located at the periphery of photosensitive region 406, or between adjacent dies, and may contain window 304 formed over alignment marks 314 (e.g., the embodiment described above in connection with FIG. 6).

Figure 9:
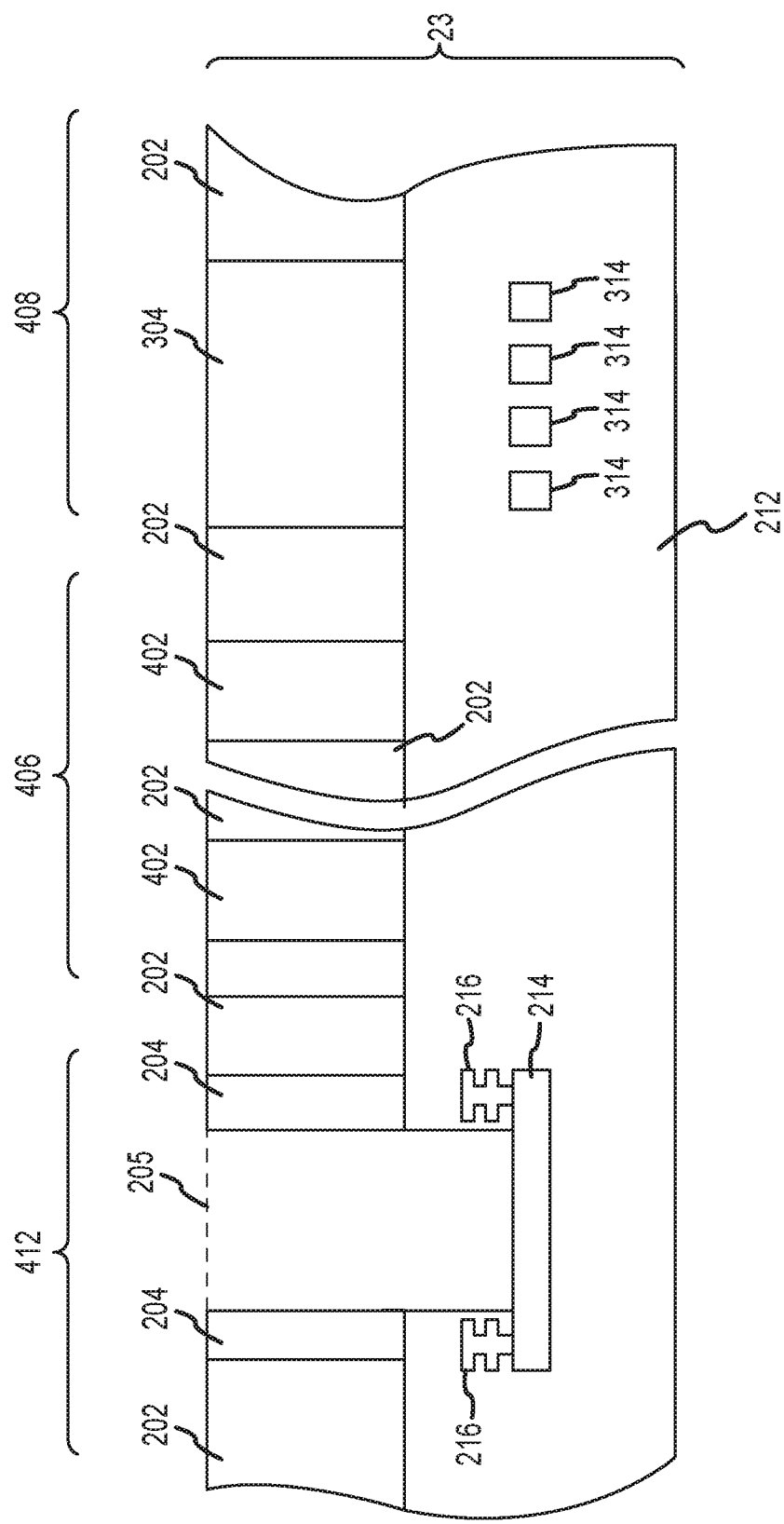
FIG. 9 is a cross-sectional side view of an intermediate processing stage of an illustrative image sensor having a bond pad recessed in a passivation layer and alignment structures formed under a window in accordance with an embodiment.

The example of FIG. 9 shows a cross-sectional side view of an intermediate processing stage of an illustrative image sensor in which a bond pad is recessed in a semiconductor substrate and a window is formed over alignment marks. As shown in FIG. 9, photosensitive region 406 may contain photodiodes 402 formed in semiconductor substrate 202, bond pad region 412 may be located at the periphery of photosensitive region 406 and may contain bond pad 214 recessed in passivation layer 212 (e.g., the embodiment described above in connection with FIG. 5), and alignment region 408 may be located at the periphery of photosensitive region 406, or between adjacent dies, and may contain window 304 formed over alignment marks 314 (e.g., the embodiment described above in connection with FIG. 6).

Figure 10:
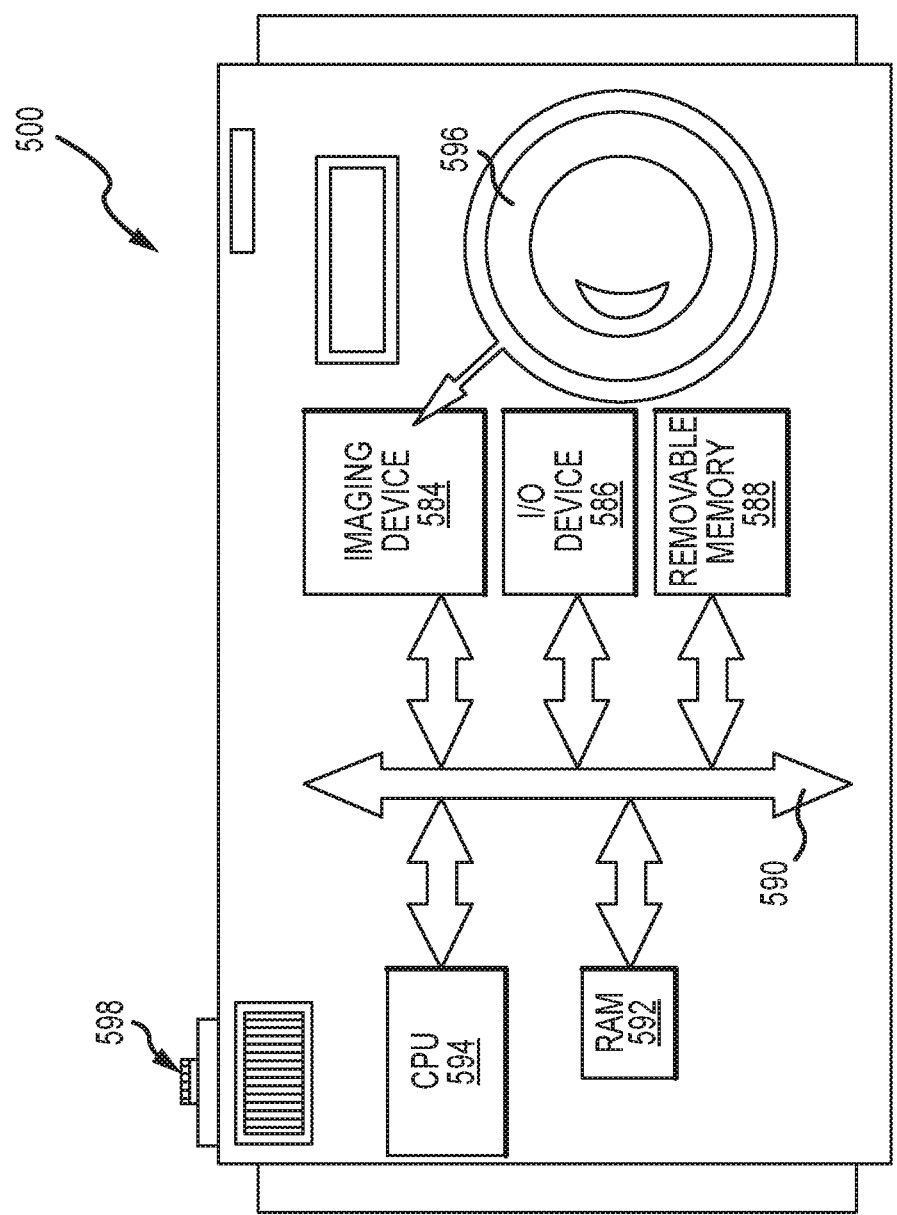
FIG. 10 is a block diagram of an illustrative processor system employing the embodiments of FIGS. 1-9 in accordance with an embodiment.

FIG. 10 is a block diagram of a processor system employing at least some of the embodiments of the image pixel array in FIGS. 3-9. Device 584 may comprise the elements of device 10 (FIG. 1) or any relevant subset of the elements. Processor system 500 is exemplary of a system having digital circuits that could include imaging device 584. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens or multiple lenses indicated by lens 596 for focusing an image onto an image sensor, image sensor array, or multiple image sensor arrays such as image sensor 16 (FIG. 1) when shutter release button 598 is pressed. Processor system 500 may include a central processing unit such as central processing unit (CPU) 594. CPU 594 may be a microprocessor that controls camera functions and one or more image flow functions and communicates with one or more input/output (I/O) devices 586 over a bus such as bus 590. Imaging device 584 may also communicate with CPU 594 over bus 590. System 500 may include random access memory (RAM) 592 and removable memory 588. Removable memory 588 may include flash memory that communicates with CPU 594 over bus 590. Imaging device 584 may be combined with CPU 594, with or without memory storage, on a single integrated circuit or on a different chip. Although bus 50 is illustrated as a single bus, it may be one or more buses or bridges or other communication paths used to interconnect the system components.

Various embodiments have been described illustrating image sensor having a substrate, an alignment region having a window formed over alignment marks, and a bond pad recessed into the substrate.

An image sensor wafer may include a substrate having a semiconductor layer, an array of photosensitive elements formed in the semiconductor layer that is at least partially surrounded by a peripheral region of the substrate, a bond pad in the peripheral region of the substrate that is recessed into the substrate wherein a top surface of the bond pad is substantially planar with a top surface of the substrate. A dielectric layer may be formed below the semiconductor layer. Input/output circuitry may be formed in the dielectric layer below the bond pad. The top surface of the bond pad may be within 0.5 um of the top surface of the substrate. The bond pad may be electrically connected to the input/output circuitry.

In some embodiments, a dielectric lining may be interposed between the bond pad and the semiconductor layer. The dielectric lining may be oxide.

In some embodiments, a dielectric window may be formed in the semiconductor layer over the input/output circuitry. The bond pad may be recessed into the dielectric window. The dielectric window may be oxide.

In some embodiments, alignment structures may be formed in the peripheral region of the substrate. The alignment structures may include a oxide transparent window in the semiconductor layer and at least one alignment mark below the transparent window.

An image sensor may include a substrate having a semiconductor layer, a dielectric layer, a pixel region, and an alignment region. The image sensor may further include an array of photodiodes in the semiconductor layer in the pixel region of the substrate, a transparent window in the semiconductor layer in the alignment region of the substrate, and at least one alignment mark in the dielectric layer in the alignment region of the substrate. The at least one alignment mark may be aligned with the transparent window. The transparent window may include dielectric material. The dielectric material may be an oxide. In some embodiments, the at least one alignment mark may be polysilicon. In some embodiments, the at least one alignment mark may be metal.

An image sensor integrated circuit may include a semiconductor layer, photosensitive elements in the semiconductor layer, a dielectric layer under the semiconductor layer, a bond pad in the semiconductor having an upper surface that is substantially level with an upper surface of the semiconductor layer, and a metal pad in the dielectric layer that is electrically connected to external circuitry.

In some embodiments, a window may be formed in the semiconductor layer over the metal pad. The window may be an oxide window. A bond pad may be recessed into the window. The window may include a hole, through which the bond pad may electrically connect to the metal pad. Gaps may be present between the bond pad and sidewalls of the window. The gaps may be filled with resin.

In some embodiments, a bond pad may be recessed into the semiconductor layer. The semiconductor layer may contain a hole, through which the bond pad electrically connects to the metal pad. An oxide liner may be formed between the bond pad and the semiconductor layer.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
   a substrate having a semiconductor layer and a dielectric layer below the semiconductor layer, wherein the semiconductor layer has a top surface and a bottom surface;
   an array of photosensitive elements in the semiconductor layer, wherein the array of photosensitive elements is at least partially surrounded by a peripheral region of the substrate;
   a dielectric window in the semiconductor layer, wherein the dielectric window has a top surface that is substantially planar with the top surface of the semiconductor layer and a bottom surface that is substantially planar with the bottom surface of the semiconductor layer; and
   a bond pad in the peripheral region of the substrate, wherein the bond pad is recessed into the dielectric window, and wherein a top surface of the bond pad is substantially planar with a top surface of the semiconductor layer.

2. The image sensor defined in claim 1, wherein the top surface of the bond pad is within 0.5 μm of the top surface of the semiconductor layer.

3. The image sensor defined in claim 2, further comprising:
   alignment structures in the peripheral region of the substrate, the alignment structures comprising:
      a transparent oxide window in the semiconductor layer; and
      at least one alignment mark below the transparent oxide window.

4. The image sensor defined in claim 1, further comprising:
   input/output circuitry in the dielectric layer below the bond pad, wherein the bond pad is electrically connected to the input/output circuitry.

5. The image sensor defined in claim 4, wherein the dielectric window comprises an additional surface that is parallel to the top and bottom surfaces of the dielectric window and interposed between the top and bottom surfaces of the dielectric window, wherein a portion of the bond pad is formed on the additional surface of the dielectric window, and wherein an additional portion of the bond pad extends through an opening in the dielectric window to contact the input/output circuitry in the dielectric layer.

6. The image sensor defined in claim 1, wherein the dielectric window comprises oxide.

7. An image sensor, comprising:
   a substrate having a semiconductor layer and a dielectric layer, wherein the substrate includes a pixel region and an alignment region;
   an array of photodiodes in the semiconductor layer in the pixel region of the substrate;
   a transparent window in the semiconductor layer in the alignment region of the substrate; and
   at least one alignment mark in the dielectric layer in the alignment region of the substrate, wherein the at least one alignment mark is directly overlapped by the transparent window and viewable through the transparent window.

8. The image sensor defined in claim 7 wherein the transparent window comprises dielectric material.

9. The image sensor defined in claim 8 wherein the dielectric material comprises an oxide.

10. The image sensor defined in claim 7 wherein the at least one alignment mark comprises polysilicon.

11. The image sensor defined in claim 7 wherein the at least one alignment mark comprises metal.

12. The image sensor defined in claim 7, wherein the semiconductor layer has first and second opposing sides, wherein the dielectric layer is formed on the first side of the semiconductor layer, and wherein a conductive pad and interconnects are formed in the dielectric layer.

13. The image sensor defined in claim 7, wherein the at least one alignment mark is completely surrounded by the dielectric layer.

14. The image sensor defined in claim 7, wherein the at least one alignment mark is embedded in the dielectric layer.

15. An image sensor integrated circuit, comprising:
   a semiconductor layer;
   photosensitive elements in the semiconductor layer;
   a first dielectric layer under the semiconductor layer;
   a bond pad in the semiconductor layer, wherein an upper surface of the bond pad is substantially level with an upper surface of the semiconductor layer;
   a second dielectric layer that is interposed between the bond pad and the semiconductor layer, wherein the second dielectric layer has an upper surface that is substantially level with the upper surface of the semiconductor layer;
   a third dielectric layer that fills at least one gap between the second dielectric layer and the bond pad, wherein the third dielectric layer has an upper surface that is substantially level with the upper surface of the semiconductor layer; and
   a metal pad in the first dielectric layer that is electrically coupled to external circuitry, wherein the bond pad is electrically connected to the metal pad.

16. The image sensor integrated circuit defined in claim 15, wherein the second dielectric layer comprises a window in the semiconductor layer over the metal pad.

17. The image sensor integrated circuit defined in claim 16, wherein the window is an oxide window.

18. The images sensor integrated circuit defined in claim 15, wherein the second dielectric layer comprises an oxide liner.

19. The image sensor integrated circuit defined in claim 15, wherein the second dielectric layer has a bottom surface that is substantially level with a bottom surface of the semiconductor layer.

20. The image sensor integrated circuit defined in claim 15, wherein the third dielectric layer comprises photoresist.

* * * * *